US006627511B1

(12) United States Patent
Racanelli et al.

(10) Patent No.: US 6,627,511 B1
(45) Date of Patent: Sep. 30, 2003

(54) REDUCED STRESS ISOLATION FOR SOI DEVICES AND A METHOD FOR FABRICATING

(75) Inventors: Marco Racanelli, Phoenix, AZ (US); Hyungcheol Shin, Gilbert, AZ (US); Heemyong Park, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 1123 days.

(21) Appl. No.: 08/508,874

(22) Filed: Jul. 28, 1995

(51) Int. Cl.$^7$ ............................................... H01L 21/76
(52) U.S. Cl. ..................... 438/404; 438/410; 438/405; 438/439
(58) Field of Search .............................. 437/69, 70, 72, 437/73, 60, 61, 62

(56) References Cited

U.S. PATENT DOCUMENTS

| | | | | |
|---|---|---|---|---|
| 4,373,965 A | | 2/1983 | Smigelski ................... | 148/1.5 |
| 4,778,775 A | * | 10/1988 | Tzeng ........................... | 437/69 |
| 4,927,780 A | | 5/1990 | Roth et al. ..................... | 437/69 |
| 5,145,802 A | * | 9/1992 | Tyson et al. .................. | 437/69 |
| 5,358,892 A | * | 10/1994 | Rolfson ......................... | 437/70 |

FOREIGN PATENT DOCUMENTS

| | | | | | |
|---|---|---|---|---|---|
| GB | 2170953 | * | 8/1986 | ................... | 437/69 |
| JP | 0152427 | * | 6/1993 | ................... | 437/69 |
| JP | 0326556 | * | 12/1993 | ................... | 437/69 |

OTHER PUBLICATIONS

Wolf; "A Review of IC Isolation Technologies—Part 6"; Solid State Technology, Dec. 1992, pp 39–41.*
Woodruff R. L. et al.: "A Differential–Height Mesa Buried Body Tie SOI Process", 1991 IEEE International SOI Conference Proceedings (CAT. No. 91CH3053–6), Vail Valley, Co., USA, Oct. 1–3, 1991, ISBN 0–7803–0184–6, New York, NY USA, IEEE, USA, pp. 148–149, (figure 1).
Ghezzo M. et al.: "LOPOS: Advanced Device Isolation for a 0.8 $\mu$m CMOS/Bulk Process Technology", Journal of the Electrochemical Society, Jul. 1989, USA, vol. 136, NR. 7, pp. 1992–1996, ISSN 0013–4651 (the whole document).
Pan P. H.: "Bird's Beak–Free Semi–Rox with Large Radius on Corner Curvature", IBM Technical Disclosure Bulletin, Nov. 1984, USA, vol. 27, NR. 6, pp. 3264–3265, ISSN 0018–8689 (the whole document).
Patent Abstracts of Japan, vol. 007, No. 140 (E–182), Jun. 18, 1983 & JP 58 052830 A (Hitachi Seisakusho KK), Mar. 29, 1983, (abstract).
Kojima M. et al., "High speed epitaxial base transistors on bonded SOI", Proceedings of the 1991 Bipolar Circuits and Technology Meeting (CAT. No. 91CH3020–5), Minneapolis, MN, USA, Sep. 9–10, 1991, ISBN 0–7803–0103–X, 1991, New York, NY, USA, IEEE, USA, pp. 63–66, (figures 2, 4).

* cited by examiner

Primary Examiner—Trung Dang

(57) ABSTRACT

A method for forming an isolation structure (22) on a SOI substrate (11) is provided. A three layer stack of an etchant barrier layer (16), a stress relief layer (17), and an oxide mask layer (18) is formed on the SOI substrate (11). The three layer stack is patterned and etched to expose portions of the etchant barrier layer (16). The silicon layer (13) below the exposed portions of the etchant barrier layer (16) is oxidized to form the isolation structure (22). The isolation structure (22) comprises a bird's head region (21) with a small encroachment which results in higher edge threshold voltage. The method requires minimum over-oxidation and provides for an isolation structure (22) that leaves the SOI substrate (11) planar. Minimal over-oxidation reduces the number of dislocations formed during the oxidation process and improves the source to drain leakage of the device.

16 Claims, 1 Drawing Sheet

REDUCED STRESS ISOLATION FOR SOI DEVICES AND A METHOD FOR FABRICATING

BACKGROUND OF THE INVENTION

The present invention relates, in general, to Silicon on Insulator (SOI) devices, and more particularly to a method for forming isolation structures between SOI devices.

SOI Field Effect Transistor (FET) devices are similar to FET devices formed in bulk silicon in that they both have a source, a drain, and a gate structure. SOI devices, however, are formed in a substrate which has a buried isolation region formed below the FET. The buried isolation region is typically formed by implanting the silicon substrate with oxygen to create a silicon dioxide region which is commonly referred to as the Separation by Implantation of Oxygen (SIMOX) process. The buried isolation region reduces or eliminates many of the parasitic problems common to FET devices made in bulk silicon.

Although the buried isolation region does eliminate the need for implanted wells to isolate devices, it is still necessary to form isolation structures between neighboring devices. One previously known technique is to form trench structures by etching away a portion of the silicon substrate between devices and perhaps filling that portion with a non-conductive substance. Unfilled trench structures, however, can present a step coverage problem since the surface of the substrate is no longer planar. The trench structures are also difficult to form and are also difficult to fill.

An alternative approach is the common Localized Oxidation of Silicon (LOCOS) technique. A silicon dioxide and silicon nitride layer are formed on the substrate and the silicon nitride layer is selectively patterned and etched. The substrate is then oxidized through the exposed portion of the silicon dioxide layer since the silicon nitride layer acts as an oxidizing barrier. This technique leads to a large encroachment of field oxide which can result in thinned silicon active areas along the device edge and low edge threshold voltage. A polysilicon buffer layer can be added to the oxidation stack to reduce the encroachment. The thicker field oxide required with Poly-Buffered LOCOS (PBL), however, results in stress-induced dislocations and increased device leakage. The PBL isolation structure also results in a non-planar structure.

Accordingly, it would be advantageous to have a method for forming an isolation structure that not only isolates neighboring devices in the SOI substrate, but does so while maintaining a small encroachment and leaving the surface of the substrate relatively planar. It would be of further advantage to provide a method for forming an isolation structure that has reduced stress during oxidation and thus reduces stress-induced leakage.

DETAILED DESCRIPTION OF THE DRAWINGS

Silicon On Insulator (SRI) or Thin Film Silicon On Insulator (TFSOI) substrates offer several advantages over devices fabricated in bulk silicon substrates. By forming devices overlying an insulating region rather than a semiconductor, many of the parasitic device parameters are improved. The buried insulating region will improve punch-through resistance, improve the sub-threshold slope, reduce the parasitic capacitance of the substrate, and improve the control of the formation of the source and drain regions.

The insulating nature of the buried silicon dioxide region simplifies the device processing steps by eliminating the need for wells or tubs to isolate devices of different conductivity. Although neighboring devices are partially isolated by the buried oxide region, there is still a need to isolate neighboring devices at the surface of the substrate. Previously known techniques have either formed trench structures which physically separate devices, or formed field oxide regions using the LOCOS technique. Both techniques will provide insulation between devices, but the LOCOS technique introduces processing difficulties for device geometries below 0.6 µm, and trench formation adds complexity and cost to the fabrication process. With ever decreasing device sizes, the sensitivity to field oxide encroachment and surface topography becomes more significant.

In the present invention, a method is provided that forms a reduced stress isolation structure at the surface of the SOI substrate to isolate a SOI device. This method is an improved technique over the LOCOS process since the method can be used to consistently fabricate devices with active area width below 0.6 microns since the bird's beak encroachment is reduced. This process reduces stress during oxidation which will reduce the number of dislocations formed and reduce source to drain leakage relative to PBL isolation. This technique also forms a bird's head structure which forms a thick silicon dioxide layer along the edge of the active area to increase the threshold voltage along the edge.

A method for fabricating the present invention will now be provided which will form a field oxide isolation structure by selectively oxidizing portions of a SOI semiconductor substrate. The embodiments of the present invention can be used to isolate neighboring SOI devices such as Bi-polar Junction Transistors (BJTs), Field Effect Transistors (FETs), P/N diodes, or the like. The isolation structure is intended to electrically isolate devices formed in the substrate and may be formed such that the isolation structure contacts the buried oxide region in a SOI substrate or only partially oxidizes the substrate.

Figure 1:
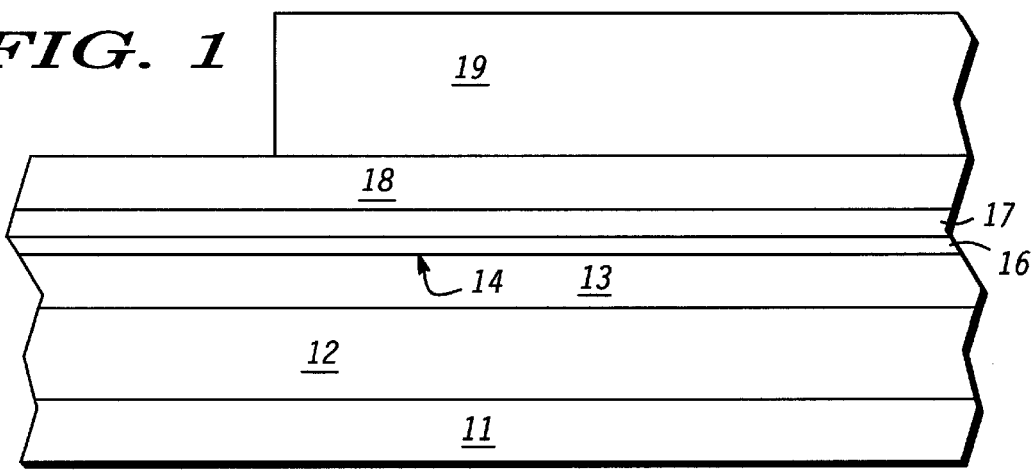
FIGS. 1–4 are enlarged cross-sectional views of a method of forming an isolation structure according to the present invention at various stages of fabrication.

FIG. 1 illustrates an enlarged cross-sectional view of a portion of SOI substrate 11 prior to forming a field oxide structure. SOI substrate 11 has a buried oxide region, buried insulating region, or buried region 12 formed below a major surface 14. Buried oxide region 12 is formed by a SIMOX process or by a bonding technique commonly known by those skilled in the art. A typical SIMOX process forms buried oxide region 12 by implanting substrate 11 with an oxygen species with a dose of approximately $1.0 \times 10^{17}$ atoms/cm$^2$ to $2.0 \times 10^{18}$ atoms/cm$^2$ and an implant energy of about 50 keV to 200 keV. Buried region 12 is formed sufficiently below surface 14 so that a silicon layer 13 of approximately 500 angstroms to 3000 angstroms in thickness remains to provide an active area in which semiconductor devices will be made.

A bonded process can also be used to form SOI substrate 11. Typically a wafer with a silicon dioxide layer overlying a silicon substrate is bonded to a second wafer of silicon only. The first or second wafer is then thinned to form the silicon/silicon dioxide/silicon stack. If a bonded process is used to form buried region 12, the thickness of silicon layer 13 can be much larger.

An etchant barrier layer 16 is then formed on major surface 14 to protect silicon layer 13 from future etch processing steps. Etchant barrier layer 16 is formed by depositing or growing a silicon dioxide layer that is 100 angstroms to 500 angstroms in thickness. The thickness of etchant barrier layer 16 should be minimized since its thickness will be directly proportional to the encroachment of the field oxide structure to be formed. Any of the known techniques such as dry oxidation, wet oxidation, chemical vapor deposition (CVD), or plasma enhanced deposition (PECVD) can be used. To provide high quality silicon dioxide, etchant barrier layer 16 is typically formed by dry oxidation at 800° C. to 1250° C. in an oxygen ambient.

A stress relief layer 17 is formed on etchant barrier layer 16 to compensate for the stress created during the future oxidation step which forms the isolation structure. Any deposition technique such as CVD or PECVD can be used to form stress relief layer 17 which comprises essentially of polysilicon. A common CVD process using the decomposition of silane at 600° C. to 750° C. can be used to form a 100 angstrom to 1000 angstrom polysilicon layer 17.

An oxide mask layer 18 is then formed on stress relief layer 17 to control which portions of silicon layer 13 will be oxidized. Comprised essentially of silicon nitride, oxide mask layer 18 is deposited by a CVD process using a silicon source and ammonia at temperatures of 650° C. to 900° C. The thickness of oxide mask layer 18 should be sufficient to retard encroachment of the field oxide into the device active area 13 and can vary from 500 angstroms to 2000 angstroms.

Oxide mask layer 18 is then selectively patterned with photoresist layer 19. Approximately 1 micron of photoresist is deposited on oxide mask layer 18 and exposed with a pattern to define where the field isolation structure will be formed. Photoresist layer 19 is then developed to leave hardened photoresist as an etch block. Photoresist layer 19 can be made of any etch blocking material used by those skilled in the art such as spin on photoresist, a dielectric layer, or the like and is formed to expose the portions of oxide mask layer 18 which will be removed.

Figure 2:
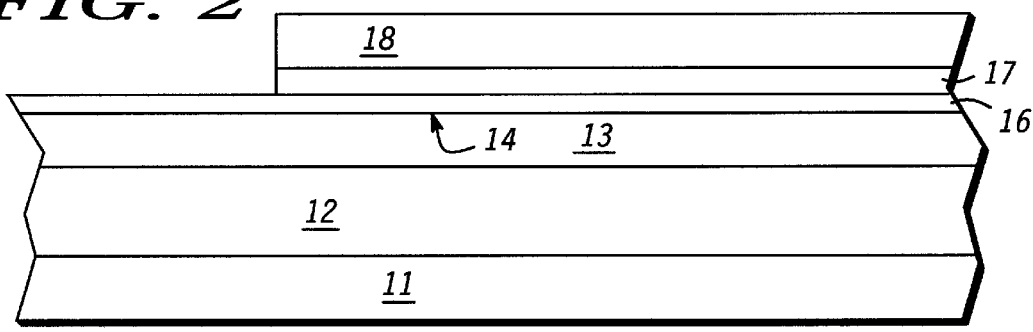

FIG. 2 shows where the isolation structure will be formed after a portion of oxide mask layer 18 and stress relief layer 17 have been removed. A Reactive Ion Etch (RIE) or plasma etch is used to remove the portions of oxide mask layer 18 and stress relief layer 17 which are not protected by portions of photoresist layer 19. Using a chlorine or fluorine ion source, layers 17 and 18 are etched preferably anisotropically to expose a portion of etchant barrier layer 16. Such etch techniques are known by those skilled in the art. Photoresist layer 19 is then removed typically with a wet etch solution comprising sulfuric acid and peroxide to prepare substrate 11 for oxidation.

Figure 3:
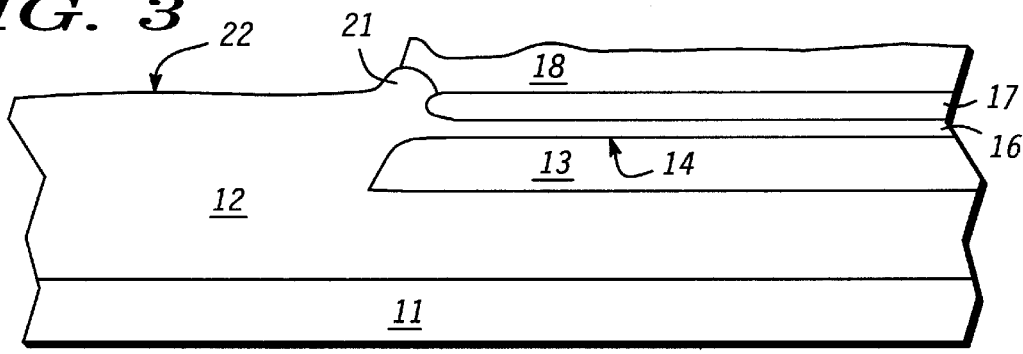

FIG. 3 illustrates an enlarged cross-sectional view of isolation structure 22 after oxidation. The oxidation consumes silicon layer 13 under the exposed portions of etchant barrier layer 16. In this embodiment, silicon layer 13 is converted to silicon dioxide and combines with etchant barrier layer 16 and buried isolation region 12 both of which are made of silicon dioxide. The combination of these three layers forms a single region of silicon dioxide such that isolation structure 22 will grow to be 100 angstroms to 2000 angstroms above surface 14. The oxidation can occur in either a wet or dry environment and is typically done in an oxygen ambient at about 700° C. to 1200° C. It is also possible to only partially oxidize silicon layer 13 so that a partial isolation structure is formed with the etchant barrier layer 16 at surface 14.

Figure 4:
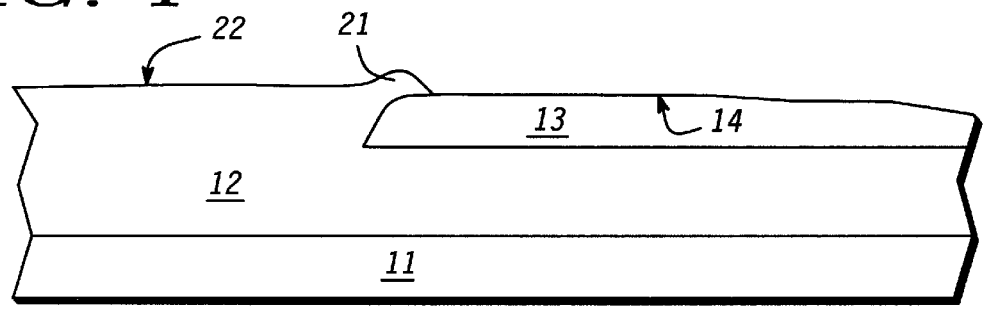

Stress relief layer 17 is allowed to partially oxidize during the formation of isolation structure 22 which will form a bird's head encroachment region 21. Bird's head region 21 provides a silicon oxide layer 100 angstroms to 1000 angstroms in thickness above the edge of active area 13 which will improve the control of the threshold voltage along the edge of active area 13. In traditional LOCOS techniques, the encroachment of the field oxide region thins the silicon along the edge of active area 13 which can result in a threshold voltage in this region that is lower than that of the rest of the device. This parasitic variation in threshold voltage can result in leakage current at standby voltages. By removing portions of stress relief layer 17 prior to oxidation, this process reduces the overall thickness of silicon dioxide which is formed compared to conventional PBL methods. The thicker field oxide required with Poly-Buffered LOCOS (PBL) results in stress-induced dislocations and increased device leakage. The PBL isolation structure also results in a non-planar structure FIG. 4 is an enlarged cross-sectional view of the present invention after further processing. During the oxidation process, some of the remaining portions of oxide mask layer 18 may be converted to silicon dioxide. This thin layer is removed with a 5–20 second etch using hydrofluoric acid. Any remaining portions of oxide mask layer 18 are removed with a wet etch of phosphoric acid, sulfuric acid, and water for 30 minutes to 4 hours. Any remaining portions of stress relief layer 17 are then removed with a wet etch comprising hydrofluoric acid, acetic acid, and nitric acid for 1 minute to 30 minutes. Etchant barrier layer 16 will protect the surface 14 of substrate 11 from any etchant that might diffuse through stress relief layer 17. Note that the wet etches used to remove oxide mask layer 18 and stress relief layer 17 will also remove a portion of isolation structure 22. Following the preceding wet etches, isolation structure 22 will be 100 angstroms to 1000 angstroms above surface 14. The final thickness of isolation structure 22 will depend on the thickness of silicon layer 13 prior to oxidation and in the present invention will vary from 200 angstroms to 2 microns.

Etchant barrier layer 16 is then removed to expose silicon layer 13 prior to forming device structures. Techniques for removal of silicon dioxide are well known in the art and typically employ a wet etch solution of water and hydrofluoric acid for 10 to 20 seconds. Further processing may be performed intended to prepare surface 14 for the formation of a high quality gate oxide. A sacrificial oxide of silicon dioxide is grown on the remaining portions of silicon layer 13. Either before or after the removal of etchant barrier layer 16, 100 angstroms to 1500 angstroms of silicon dioxide are formed on silicon layer 13. Again using known methods for etching silicon dioxide, the sacrificial layer is removed leaving the completed isolation structure 22 as shown in FIG. 4.

By now it should be appreciated that the present invention provides a method for forming isolation structure 22 in SOI substrate 11. The advantages of using a three layered oxidizing stack and patterning both oxide mask 18 and stress relief layer 17, thus reducing the required thickness of isolation structure 22 over previously known techniques, are numerous. For devices built in SOI substrate 11, the required thickness of isolation structure 22 is determined by the amount of silicon above buried oxide layer 12. By removing the polysilicon layer prior to the oxidation process, the required thickness of isolation structure 22 is reduced. The need to form isolation structures between tightly spaced active areas requires some over-oxidation since oxidation rates are slower in tight spaces. When a thinner field oxide is required, as in the present invention, the need for over-oxidation is reduced. The reduced over-oxidation leads to lower stress along the edge of active area 13 which is known to cause dislocations and source to drain leakage.

The present invention also forms a bird's head region 21 over the edge of the active region of silicon layer 13. This results in a thicker field oxide over the edge of active area 13 to compensate for the thinned silicon in this region. The threshold voltage of a device has two components; the threshold voltage of the bulk of the device and the threshold voltage of the portion of the device near the edge of active area 13. The thicker oxide will increase the threshold voltage of the portion of a device formed along the edge of active area 13 and thus reduce parasitic leakage. Field oxide structure 22 is relatively planar with the surface 14 of silicon layer 13 which improves the quality of photolithography steps to follow. Since this method also reduces the encroachment of field oxide structure 22 into active area 13, the geometries can be scaled down further than conventional PBL.

What is claimed is:

1. A method for fabricating a reduced stress isolation structure for a SOI device comprising the steps of:

providing a semiconductor substrate having a buried region of silicon dioxide below a major surface and a silicon layer below the major surface and above the buried region of silicon dioxide;

disposing a first layer on the major surface;

disposing a second layer overlying the first layer, wherein the second layer has a first portion and a second portion;

disposing a third layer overlying the second layer, wherein the third layer has a first portion and a second portion;

removing the first portion of the third layer;

removing the first portion of the second layer;

oxidizing the semiconductor substrate to form an isolation structure, a portion of the isolation structure protrudes above the major surface of the semiconductor substrate and is overlying an edge of the silicon layer;

removing the second portion of the third layer; and removing the second portion of the second layer.

2. The method for fabricating a reduced stress isolation structure for a SOI device of claim 1 wherein the step of disposing the first layer further comprises the step of forming a silicon dioxide layer on the major surface with a thickness of 100 angstroms to 500 angstroms.

3. The method for fabricating a reduced stress isolation structure for a SOI device of claim 1 wherein the step of disposing the second layer further comprises the step of forming a polysilicon layer on the first layer with a thickness of 100 angstroms to 1000 angstroms.

4. The method for fabricating an isolation structure for a SOI device of claim 1 wherein the step of disposing the third layer further comprises the step of forming a silicon nitride layer on the second layer with a thickness of 500 angstroms to 2000 angstroms.

5. The method for fabricating a reduced stress isolation structure for a SOI device of claim 1 further comprising the step of oxidizing the semiconductor substrate such that the isolation structure contacts the buried region of silicon dioxide.

6. The method for fabricating a reduced stress isolation structure for a SOI device of claim 1 further comprising the step of removing the second portion of the third layer with a wet etch comprising phosphoric acid and water.

7. The method for fabricating a reduced stress isolation structure for a SOI device of claim 1 further comprising the step of removing the second portion of the second layer with a wet etch comprising hydrofluoric acid, acetic acid, nitric acid, and water.

8. The method for fabricating a reduced stress isolation structure for a SOI device of claim 1 further comprising the step of removing the first layer with a wet etch comprising hydrofluoric acid and water.

9. The method for fabricating a reduced stress isolation structure for a SOI device of claim 1 further comprising the steps of:

growing a sacrificial oxide on the major surface; and removing the sacrificial oxide.

10. A process for forming a field oxide isolation structure on a SOI substrate comprising the steps of:

providing a substrate having a silicon layer and a buried insulating region formed below the silicon layer;

forming an etchant barrier layer on the silicon layer;

forming a stress relief layer on the etchant barrier layer;

forming an oxidation mask layer on the stress relief layer;

removing a portion of the oxidation mask layer and a portion of the stress relief layer;

oxidizing the silicon layer through the etchant barrier layer to form an isolation structure having a bird's head encroachment region that is above an edge of the silicon layer;

removing remaining portions of the oxidation mask layer; and removing remaining portions of the stress relief layer.

11. The process for forming a field oxide isolation structure on a SOI substrate of claim 10 wherein the step of providing the substrate comprises the step of forming the buried insulating region by implanting the substrate with oxygen to form a region of silicon dioxide in the substrate.

12. The process for forming a field oxide isolation structure on a SOI substrate of claim 10 wherein the step of providing the substrate comprises the step of bonding a first wafer having a silicon dioxide layer to a second wafer having the silicon layer, wherein the silicon layer is bonded to the silicon dioxide layer.

13. The process for forming a field oxide isolation structure on a SOI substrate of claim 10 further comprising the step of forming the etchant barrier layer with silicon dioxide.

14. The process for forming a field oxide isolation structure on a SOI substrate of claim 10 further comprising the step of forming the stress relief layer with silicon.

15. The process for forming a field oxide isolation structure on a SOI substrate of claim 10 further comprising the step of forming the oxidation mask layer with silicon nitride.

16. The process for forming a field oxide isolation structure on a SOI substrate of claim 10 further comprising the steps of:

forming a silicon dioxide layer on the substrate; and removing the silicon dioxide layer to expose at least a portion of the substrate.

* * * * *